United States Patent [19]

Phelps, Jr. et al.

[11] Patent Number: 4,878,108
[45] Date of Patent: Oct. 31, 1989

[54] HEAT DISSIPATION PACKAGE FOR INTEGRATED CIRCUITS

[75] Inventors: Douglas W. Phelps, Jr.; William C. Ward, both of Burlington, Vt.

[73] Assignee: International Business Machines Corporation, Armonk, N.Y.

[21] Appl. No.: 61,649

[22] Filed: Jun. 15, 1987

[51] Int. Cl.$^4$ .................................. H01L 23/02
[52] U.S. Cl. ............................. 357/81; 357/72
[58] Field of Search ................. 357/81, 79, 74, 72

[56] References Cited

U.S. PATENT DOCUMENTS

| | | | |
|---|---|---|---|
| 3,670,215 | 6/1972 | Wilkens | 317/234 R |
| 3,780,795 | 12/1973 | Arnold | 357/81 |
| 3,836,825 | 9/1974 | Hall et al. | 357/81 |
| 3,911,327 | 10/1975 | Murari et al. | 357/79 |
| 4,079,511 | 3/1978 | Grabbe | 357/72 |
| 4,259,685 | 3/1981 | Romano | 357/72 |
| 4,342,068 | 7/1982 | Kling | 357/81 |
| 4,460,917 | 7/1984 | Rogers | 357/74 |
| 4,561,011 | 12/1985 | Kohara et al. | 357/81 |
| 4,648,008 | 3/1987 | Neyroud et al. | 357/81 |
| 4,688,077 | 8/1987 | Wakabayashi et al. | 357/81 |
| 4,712,159 | 12/1987 | Clemens | 357/81 |

FOREIGN PATENT DOCUMENTS 60-133737 7/1985 Japan ........................... 357/79

OTHER PUBLICATIONS

Grabbe et al., Automated Packaging of a Premolded Chip Carrier, 1979, pp. 1–7.
2280/2286 Series Heat Sinks for Leadless Chip Carriers and Flat Paks.
2244 Research Disclosure (1986) May, No. 265, New York, U.S.A.

Primary Examiner—Rolf Hille
Assistant Examiner—T. Le Hoanganh
Attorney, Agent, or Firm—Sughrue, Mion, Zinn, Macpeak & Seas

[57] ABSTRACT

A package for heat dissipation of electronic components mounted on a strip of thermally conductive material. A plastic body is molded to encapsulate the component and strip with extended mold ejector pins employed to form a recess such that access to the thermally conductive strip is obtained. An external heat sink is mounted onto the plastic body. A clip or through bolt establishes thermal contact between the external heat sink and the internal thermally conductive strip.

26 Claims, 1 Drawing Sheet

HEAT DISSIPATION PACKAGE FOR INTEGRATED CIRCUITS

BACKGROUND OF THE INVENTION

This invention is related to the packaging of electronics devices and in particular, to a heat dissipation system for semiconductor integrated circuits. Semiconductor integrated circuit devices, such as chips and dies, are small in size and are designed to handle large amounts of power. A standing requirement in the packaging of integrated circuits is to provide, to the extent possible, maximum chip density to decrease conductor lengths. The resultant higher power levels which are used have a co-commitment requirement that the heat which is generated be effectively dissipated. This in turn has led to the use of a variety of heat dissipaters known as heat sinks. Such are required to achieve thermal stability for the integrated circuit.

Prior art techniques have been so large, heavy and expensive that in many cases the heat sinks more than offset the space and weight advantages which are gained by the use of integrated circuit devices. Prior art packaging techniques to achieve dissipation have followed a variety of alternative paths. One known technique is to have an integrated circuit mounted on a metallic strip of heat sink material. The chip and its heat sink mount are then encased in a dielectric casing with the metallic strip extending through the casing at various points and functioning as a conductive heat dissipation tab. The casing itself may be plastic or ceramic or another suitable dielectric material. This eliminates the use of a metal housing which is more costly. Such devices however present problems in not providing sufficient external surface area in which to provide effective heat dissipation. Additionally, the problem of physical attachment of the semiconductor device to the heat sink presents an additional problem. For example if a screw mount technique is used then a torque limiting tool may be required to ensure that the screw is tight enough to prevent shifting yet not be so tight as to break the plastic casing. An example of such packaging is illustrated in U.S. Pat. No. 3,670,215 having a chip mounted to a strip with the strip then extending through the package. A significant problem with such a system is the high cost and low through-put of fabrication. Consequently, while effective as a technique of heat dissipation, the increased cost and complexity of fabrication make it commercially unattractive. Moreover, the package itself may be weakened by the increased percentage of metal which passes through that housing.

U.S. Pat. No. 3,783,345 while not strictly applicable to integrated circuits illustrates the use of a single diode die and a thyrector, for the purpose of eliminating voltage spikes and achieving wrong polarity protection. In the '345 patent heat passes through a plastic matrix so there is no direct metal contact between the semiconductor element and the heat sink. That is, heat transfer is effectuated through the encapsulate material, a resin. This is a common problem in the prior art, that is, the molded body is a poor conductor of heat. U.S. Pat. No. 4,538,168 discloses an opposite technique for providing thermal dissipation in single diode dies. Again, while not applicable to integrated circuit chip fabrication since no lead frame is used or contemplated, a metal extruded carrier is employed with the diode encapsulated or potted on three sides. The high cost and low through-put fabrication of such devices makes them economically unsuitable for use with integrated circuit systems.

Heat sink techniques for use with single transistors for example, to provide alignment of carrier strips or to prevent peel, are disclosed in U.S. Pat. Nos. 3,418,089 and 4,107,727. Such systems do not employ lead frame technology and are not applicable for use in integrated circuit packaging techniques. An example of a chip carrier which encapsulates to provide heat dissipation is disclosed in U.S. Pat. No. 4,147,889. Heat dissipation in this system occurs through a glass epoxy or insulator material thereby lowering heat dissipation effectiveness. The system also requires many folding and bending steps thereby raising the cost and making it not applicable to situations where high through-put fabrication is required to lower the overall cost of the integrated circuit package.

SUMMARY OF THE INVENTION

Given these deficiencies in the prior art, it is an object of this invention to provide an integrated circuit packaging technique which provides a conductive metal heat transfer path from the chip to an external heat sink.

Another object of this invention is to provide a universal package mold which will allow for either standard packages or thermally enhanced packages as a function of encapsulated chip density.

In that regard, it is a further object of this invention to provide increased density and higher power chip packaging in a plastic package.

Yet another object of this invention is to provide a system of heat dissipation in integrated circuit packaging which decreases manufacturing steps, increases manufacturing efficiency, and therefore lowers costs while at the same time improving through-put.

These and other objects of this invention are achieved in an assembly process, as follows, which produces a thermally enhanced package of small outline for use in integrated circuit technology. Chip processing proceeds in a normal manner to the point of back-side mounting on a substrate used for heat transfer. The chips are back bonded to a strip of heat sink material, typically a copper alloy, utilizing a conductive bonding material such a silver filled polyimide or epoxy. It will be appreciated that other suitable heat sink materials may be employed. The heat sink strip extends beyond the chip edges. The chip and the heat sink is then subjected to molding wherein they are housed in a plastic molded body. The molded body includes two or more recesses used by mold ejector pins to remove the molded body from the mold while creating cavities providing external access to the heat sink strip. By means of a tape controlled drilling step, holes are drilled through the plastic body at locations corresponding to ejector pin recess sites to the heat sink strip.

In one embodiment a heat transfer spring clip couples the heat sink strip chip mount to an external heat sink. The clip is attached to the heat sink strip by a solder ring. In a second embodiment a through-bolt in contact with both the strip heat sink and the external heat sink provides the heat transfer path. The bolt provides a compression mount for the external heat sink. (Drilling occurs at ejector pin sites to provide a zone for metal to metal contact with the heat sink strip.)

This invention will be described in greater detail by reference to the attached drawing and the description of the preferred embodiments that follows.

DETAILED DESCRIPTION OF THE PREFERRED EMBODIMENTS

Figure 1:
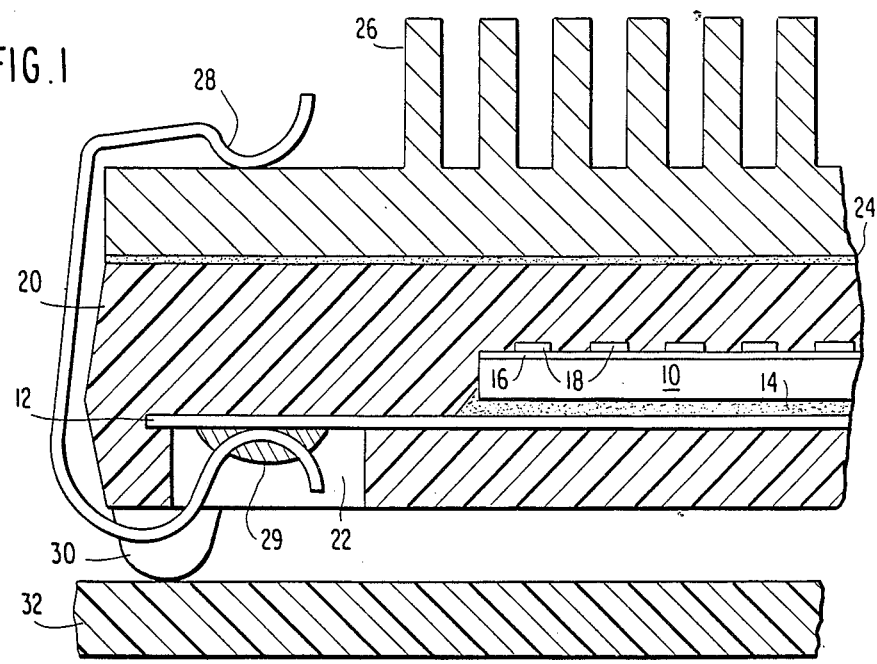
FIG. 1 is a schematic cut-away side view of a first embodiment of this invention.

Referring to FIG. 1 a schematic cut-away partial side view of first embodiment of this invention is depicted. An integrated circuit chip 10 is back bonded to a strip of heat sink material 12 by means of a suitable back bond material 14. The heat sink material 12 is typically a copper alloy, nickel/Iron alloy, Kovar, copper/Invar/-copper material that, as illustrated in FIG. 1 extends beyond the lateral side edges of the chip 10.

The back bond material 14 is typically a silver filled polyimide or epoxy, or other suitable mounting material. In those instances where it is desired to electrically isolate the chip 10 from the heat sink strip 12, a non-metallic material may be used. In this case the same adhesive material would be employed but would not have a metallic component, but having a dielectric thermal compound it its place. The top surface of the chip contains an alpha barrier 16 and a series of bonded leads 18.

In accordance with this invention a plastic molded body is formed around the chip and its heat sink mount 12.

Such techniques of plastic molding the body 20 are well known in the technology. Following molding of the body 20, by molding with raised ejector pins, a cavity 22 is formed at mold ejector pins sites. That is, during the molding of the body 20, recesses are formed at ejector pin sites. The pins are used to displace the mold material during molding of the body 20. At those locations where the ejector pins contact the body, a cavity is formed providing access to the heat sink strip. Then, by known techniques such as media blast, the cavity 22 is cleaned out to provide a clean exposed surface of the heat sink strip 12. On one surface of the plastic molded body 20 a suitable thermal grease layer 24 is placed and the external heat sink 26 then overlies the plastic molded body on the thermal grease. As illustrated in FIG. 1, the external heat sink 26 has a plurality of fins which provide heat dissipation surfaces.

As illustrated in FIG. 1, a heat transfer spring clip is mounted with one side in the recess 22 and an opposite side of the clip in contact with the heat sink 26. Thus, the spring clip 28 establishes thermal conductivity between the heat sink strip 12 and the external heat sink 26. The spring clip 28 is prepared with a solder ring 29 having with it the necessary flux. The solder ring with flux is reflowed during processing, typically during a 215° C. vapor phase solder reflow module to card mounting, simultaneously attaching the spring clip in a firm fixed mounting position to the heat sink material 12 thereby maintaining alignment and further enhancing thermal conductivity.

Next, by use of a series of stand-offs 30 the device is mounted on a card or board 32. As is apparent from FIG. 1, in accordance with this invention, heat produced by the chip 10 is dissipated both through molded body 20 and the conductive back bond material 14 into the heat sink strip 12. Then, by thermal transfer via the molded body and further enhanced by the spring clip 28, heat dissipation occurs at the external heat sink 26. Leads 18, exit the package at the mold part line typically on two or more sides and opposing spring clips are employed at a location not interring with the I/0 leads.

Figure 2:
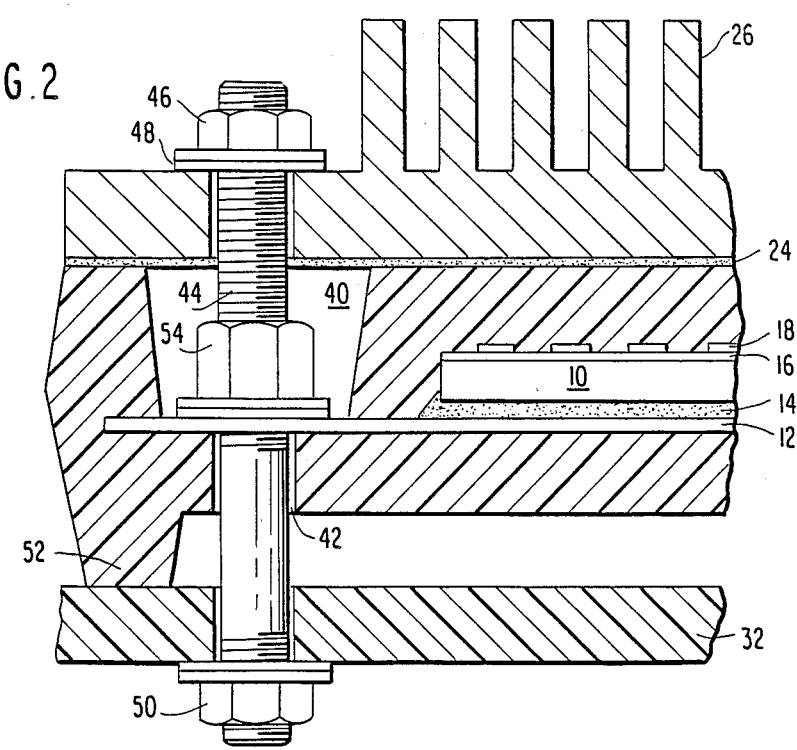
FIG. 2 is a schematic cut-away side view of a second embodiment of this invention.

A second embodiment of this invention is illustrated in FIG. 2 wherein like elements found in FIG. 1 bear the same numbers. In accordance with the embodiment of FIG. 2, processing proceeds in the same manner as that in FIG. 1 through the molding of the body 20. However, in accordance with the embodiment of FIG. 2, a step of tape controlled drilling takes place through the plastic body 20 to open cavity 42. In the FIG. 1 embodiment, the cavity 22 is opened solely by the mold ejector pins. In the FIG. 2 embodiment, cavity 40 is initially created for the mold ejector pins however, drilling then occurs to open the body up all the way through the heat sink strip 12 forming a second cavity 42.

A thermal conductive path from the heat strip 12 to the external heat sink 26 is provided by a heat transfer bolt 44. The heat transfer bolt 44 is fixed to the external heat sink 26 by means of a lock nut 46. A suitable thermally conductive grease material or star washer 48 may be placed between the lock nut 46 and the top surface of the external heat sink 26. The lower portion of the thermally conductive bolt 44 is attached to the circuit card or board 32 by means of a second lock nut 50.

FIG. 2 illustrates the use legs 52 which are part of the molded body 20 and serve as stand-offs between the molded body, 20 and the circuit card or board 32. Alternatively, the stand-off elements 30 illustrated in the FIG. 1 embodiment may be used if a common mold is desired for the production of the molded body 20.

In addition to providing the heat transfer path from the heat strip material 12 to the external heat sink 26, the heat transfer bolt 44 serves to place the entire device of FIG. 2 in compression. This increases the strength of the plastic package by having it locked between metallic external heat sink 26 and the rigid circuit card or board 32.

As illustrated in FIG. 2 heat transfer contact between the bolt 44 and strip 12 occurs by means of a locking nut 54. This nut is threaded on the bolt 44 with a star washer and tightened prior to mounting the external heat sink 26. It is apparent that lock rings, split rings or swaged washers can also be employed to affix the bolt 44 to the heat sink strip 12 in a thermal transfer relationship. The cavity 40 is large enough to also accommodate insertion of a locking tool for nut 54 or alternatively, the cavity can be formed having a shape to rotationally secure the nut. As illustrated, the bolt 44 is threaded in the vicinity of strip 12 to engage nut 54. The ends of the bolt are also threaded to engage nuts 46 and 50. Alternatively, the bolt has a star washer 48 to provide additional contact and locking area on the heat sink 26.

It is apparent that changes and modifications to this invention may be made without departing from the scope thereof.

What is claimed is:

1. A package for heat dissipation of electronic components comprising:
    an electronic component mounted on a strip of thermally conductive material;
    a plastic body molded to encapsulate said electronic component and said strip of thermally conductive material, said plastic body having a recess formed during molding by ejector pins to expose said strip of thermally conductive material;
    an external heat sink affixed to said plastic body;

thermally conductive means to establish via said recess thermal contact between said strip of thermally conductive material and said external heat sink to enhance the dissipation heat generated by said electronic component;

wherein said thermally conductive means comprises a heat transfer spring clip having a pair of contact surfaces, one of said contact surfaces disposed in said recess in contact with said strip of thermally conductive material and the second of said contact surfaces contacting said external heat sink.

2. The package of claim 1, wherein said electronic component is back bonded to said strip of thermally conductive material, said strip extending laterally beyond said electronic component and said thermally conductive means contacting said strip of thermally conductive material in the region of the lateral extension thereof beyond said electronic component.

3. The package of claim 1, further comprising a circuit carrying element and a stand-off between said plastic body and said circuit carrying element.

4. A package for heat dissipation of electronic components comprising:
a molded plastic body encapsulating an electronic component and a thermally conductive strip mount for said electronic component, an external heat sink on said plastic body, said body having a recess therein; and
thermally conductive means establishing via said recess a thermal path between said external heat sink and said encapsulated strip mount to dissipate heat generated by said electronic component;
wherein said recess in said plastic body formed during molding by mold ejector pins exposes said strip of thermally conductive material; and
said thermally conductive means comprises a heat transfer spring clip having a pair of contact surfaces, one of said contact surfaces disposed in said recess in contact with said strip of thermally conductive material and the second of said contact surfaces contacting said external heat sink.

5. The package of claim 4, wherein said recess in said plastic body formed during molding by mold ejector pins exposes said strip of thermally conductive material.

6. The package of claim 5, wherein said thermally conductive means comprises a heat transfer spring clip having a pair of contact surfaces, one of said contact surfaces disposed in said recess in contact with said strip of thermally conductive material and the second of said contact surfaces contacting said external heat sink.

7. The package of claim 6, wherein said spring clip comprises a solder ring with flux to attach the first of said contact surfaces to said strip of thermally conductive material.

8. The package of claim 4, wherein said electronic component is back bonded to said strip of thermally conductive material, said strip extending laterally beyond said electronic component and said thermally conductive means contacting said strip of thermally conductive material in the region of the lateral extension thereof beyond said electronic component.

9. The package of claim 4, wherein said plastic body comprises a through-hole formed in said plastic body to provide access to said strip of thermally conductive material.

10. The package of claim 4, further comprising a circuit carrying element and a stand-off between said plastic body and said circuit carrying element.

11. A package for heat dissipation of electronic components comprising:
an electronic component mounted on a strip of thermally conductive material;
a plastic body molded to encapsulate said electronic component and said strip of thermally conductive material, said plastic body having a recess;
an external heat sink affixed to said plastic body;
thermally conductive means to establish via said recess thermal contact between said strip of thermally conductive material and said external heat sink to enhance the dissipation heat generated by said electronic component;
wherein said electronic component is back bonded to said strip of thermally conductive material, said strip extending laterally beyond said electronic component and said thermally conductive means contacting said strip of thermally conductive material in the region of the lateral extension thereof beyond said electronic component.

12. The package of claim 1, wherein said recess in said plastic body formed during molding by mold ejector pins exposes said strip of thermally conductive material.

13. The package of claim 12, wherein said thermally conductive means comprises a heat transfer spring clip having a pair of contact surfaces, one of said contact surfaces disposed in said recess in contact with said strip of thermally conductive material and the second of said contact surfaces contacting said external heat sink.

14. The package of claim 13, wherein said spring clip comprises a solder ring with flux to attach the first of said contact surfaces to said strip of thermally conductive material.

15. The package of claim 11, wherein said plastic body comprises a through-hole formed in said plastic body to provide access to said strip of thermally conductive material.

16. A package for heat dissipation of electronic components comprising:
an electronic component mounted on a strip of thermally conductive material;
a plastic body molded to encapsulate said electronic component and said strip of thermally conductive material, said plastic body having a recess;
an external heat sink affixed to said plastic body;
thermally conductive means to establish via said recess thermal contact between said strip of thermally conductive material and said external heat sink to enhance the dissipation heat generated by said electronic component;
wherein said plastic body comprises a through-hole formed in said plastic body to provide access to said strip of thermally conductive material.

17. The package of claim 16, wherein said thermally conductive means comprises a heat transfer bolt inserted in said through-hole, said heat transfer bolt having a surface in contact with said strip of thermally conductive material and being in thermal transfer contact with said external heat sink.

18. The package of claim 17, wherein said heat transfer bolt passes through said external heat sink and said plastic body, said bolt having at one end a compression member to clamp said plastic body and said external heat sink in compression.

19. A package for heat dissipation of electronic components comprising:

an electronic component mounted on a strip of thermally conductive material;

a plastic body molded to encapsulate said electronic component and said strip of thermally conductive material, said plastic body having a recess;

an external heat sink affixed to said plastic body;

thermally conductive means to establish via said recess thermal contact between said strip of thermally conductive material and said external heat sink to enhance the dissipation heat generated by said electronic component; and a circuit carrying element and a stand-off between said plastic body, and said circuit carrying element.

20. The package of claim 19, wherein said thermally conductive means comprises a heat transfer bolt, said heat transfer bolt passing through said external heat sink, said plastic body including said strip of thermally conductive material embedded therein, and said circuit carrying elements, and means attached to ends of bolts to clamp said external heat sink, said plastic body and said circuit carrying element in compression with each other.

21. A package for heat dissipation of electronic components comprising:

a molded plastic body encapsulating an electronic component and a thermally conductive strip mount for said electronic component, an external heat sink on said plastic body, said body having a recess therein; and thermally conductive means establishing via said recess a thermal path between said external heat sink and said encapsulated strip mount to dissipate heat generated by said electronic component;

wherein said electronic component is back bonded to said strip of thermally conductive material, said strip extending laterally beyond said electronic component and said thermally conductive means contacting said strip of thermally conductive material in the region of the lateral extension thereof beyond said electronic component.

22. The package of claim 21, wherein said thermally conductive means comprises a heat transfer bolt inserted in said through-hole, said heat transfer bolt having a surface in contact with said strip of thermally conductive material and being in thermal transfer contact with said external heat sink.

23. The package of claim 22, wherein said heat transfer bolt passes through said external heat sink and said plastic body, said bolt having at one end a compression member to clamp said plastic body and said external heat sink in compression.

24. A package for heat dissipation of electronic components comprising:

a molded plastic body encapsulating an electronic component and a thermally conductive strip mount for said electronic component, an external heat sink on said plastic body, said body having a recess therein; and thermally conductive means establishing via said recess a thermal path between said external heat sink and said encapsulated strip mount to dissipate heat generated by said electronic component;

wherein said plastic body comprises a through-hole formed in said plastic body to provide access to said strip of thermally conductive material.

25. A package for heat dissipation of electronic components comprising:

a molded plastic body encapsulating an electronic component and a thermally conductive strip mount for said electronic component, an external heat sink on said plastic body, said body having a recess therein;

thermally conductive means establishing via said recess a thermal path between said external heat sink and said encapsulated strip mount to dissipate heat generated by said electronic component; and a circuit carrying element and a stand-off between said plastic body and said circuit carrying element.

26. The package of claim 25, wherein said thermally conductive means comprises a heat transfer bolt, said heat transfer bolt passing through said external heat sink, said plastic body including said strip of thermally conductive material embedded therein, and said circuit carrying elements, and means attached to ends of bolts to clamp said external heat sink, said plastic body and said circuit carrying element in compression with each other.

* * * * *